(12) United States Patent
Holsinger et al.

(10) Patent No.: US 6,333,630 B1
(45) Date of Patent: Dec. 25, 2001

(54) MAGNETIC FIELD GENERATING APPARATUS FOR MAGNETIC RESONANCE IMAGING SYSTEM

(75) Inventors: Ronald F. Holsinger, Action, MA (US); Kang-suk Lee, Seongnam (KR); Chi-woong Mun, Seoul (KR); Chang-wook Moon, Seoul (KR); Jung-hoe Kim, Seoul (KR); Sang-bok Nam, Euiwang (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/568,124

(22) Filed: May 10, 2000

(30) Foreign Application Priority Data

May 10, 1999 (KR) .................................................. 99-16601

(51) Int. Cl.[7] ....................................................... G01V 3/00
(52) U.S. Cl. ........................................... 324/319; 324/320
(58) Field of Search .................... 324/320, 319, 324/318, 300, 307, 309; 335/296, 297, 301

(56) References Cited

U.S. PATENT DOCUMENTS

| | | | |
|---|---|---|---|
| 4,580,098 | 4/1986 | Gluckstern et al. | 324/307 |
| 4,679,022 | 7/1987 | Miyamoto et al. | 335/296 |
| 4,777,464 | 10/1988 | Takabatashi et al. | 335/306 |
| 5,475,355 | * 12/1995 | Abele et al. | 335/301 |
| 6,147,578 | * 11/2000 | Panfil et al. | 335/296 |
| 6,191,584 | * 2/2001 | Trequattrini et al. | 324/319 |

\* cited by examiner

Primary Examiner—Louis Arana
(74) Attorney, Agent, or Firm—Law Offices of Eugene M. Lee, PLLC (57) ABSTRACT

A magnetic field generating apparatus for a magnetic resonance imaging (MRI) system adopting a C-shaped open magnet support structure includes a pair of polygonal permanent magnets disposed parallel to each other in the horizontal plane, with a predetermined imaging area therebetween; a pair of polygonal magnetic pole plates, stacked to face each other on the inner sides of the pair of permanent magnets, respectively; a pair of yokes to which the permanent magnets are fixed; at least one column for connecting the two yokes at one ends thereof with the imaging area being interposed between the yokes, wherein the at least one column together with the pair of yokes forms a closed path of the magnetic field; shims disposed at the vertexes of the polygonal magnetic pole plates, the shims having a polygonal shape, wherein the shims of one of the polygonal magnetic pole plates face those of the other polygonal magnetic pole plate; peripheral permanent magnets disposed along the edges of the polygonal magnetic pole plates, wherein the peripheral permanent magnets of one of the polygonal magnetic pole plates face those of the other polygonal magnetic pole plate; and booster shims arranged in the spaces between adjacent peripheral permanent magnets disposed at the vertexes of the polygonal magnetic pole plates.

10 Claims, 6 Drawing Sheets

MAGNETIC FIELD GENERATING APPARATUS FOR MAGNETIC RESONANCE IMAGING SYSTEM

BACKGROUND OF THE INVENTION

1. Field of the Invention

The present invention relates to a magnetic field generating apparatus for a magnetic resonance imaging (MRI) system, in which permanent magnets and a steel element are arranged to produce a controlled magnetic field within a specified volume between magnetic pole surfaces.

2. Description of the Related Art

An important aspect in the medical field and applications of a magnetic resonance imaging (MRI) system is the uniformity of a magnetic field within the separation between two magnetic pole surfaces facing each other. As defined herein, the magnetic pole is a north or south pole of a magnet, such as an electromagnet, a permanent magnet or a superconductive magnet, or any magnet surface where the field flux lines are to be controlled. The magnetic field emanates from one magnetic pole surface and terminates at the other magnetic pole surface. Typically, the magnetic pole surfaces are flat in the central portion which is close to an object to be photographed, for example, the body of a patent.

The magnetic flux density is commonly labeled B and the magnetic field strength is conventionally labeled H (each being vector quantities having direction). The uniformity of the magnetic field depends in part upon the uniformity of the separation between the magnetic pole surfaces, the homogeneity and permeability of the pole material, and the pole correction (shim) method, i.e., adding or subtracting small rings or buttons of ions on the pole surface. For cylindrical or polygonal poles with flat surfaces the concentricity of the cylinders (or polygons), and the separation and parallelism of the pole surfaces, must be precisely controlled to produce a uniform field. Thus, the pole holding structure must be controlled to hold the two magnetic pole surfaces at a precise distance apart, at a precise concentricity, and at a precise angular orientation (usually parallel).

Also, such a pole holding structure must be constructed to accommodate other auxiliary magnets used to shim and confine the various magnetic fields. One such feature concerns the flux return path. There is a need for an efficient design of a structure which minimizes the volumes of permanent magnets and the material (such as steel) surrounding them while still providing a given uniform field. Another need is a structure that allows adjustment of the field strength of the individual poles, or "pole strength matching". Since the flux (B) lines have no end points—the lines form closed loops—use of materials, relative physical sizes and orientations of structures affecting any part of the flux lines must be controlled to provide a given field strength and homogeneity. The support and positioning structures are adjustable, allowing fine adjustment of the separation and parallelism of the pole surfaces. This is necessary, for example, to compensate for manufacturing tolerances.

Table 1 illustrates the comparison of three types of permanent magnetic circuits for MRI systems. In particular, characteristics of a tunnel-like magnetic system of the prior art, an ordinary magnetic system of the prior art and an embodiment of a magnetic system according to the present invention are tabulated in Table 1. From Table 1, it can be understood that the configuration becomes complicated to meet the requirements according to the development of a new technique.

TABLE 1

| | Type of magnet system | | |
| --- | --- | --- | --- |
| Characteristcs | Tunnel-like magnet system | Ordinary magnet system | Novel magnet system |
| Magnetic circuit | | | |
| Size of magnetic circuit | Small | Medium | Small |
| Tolerance for magnetic properties | Small | Large | Medium |
| Easiness for assembly | Difficult | Easy | Easy |
| Flux leakage | Small | Small | Very small |
| Temperature dependence | Large | Medium | Medium |
| Magnetic field shielding | No shielding | Medium | Large |
| Sensitivity for steel | Large | Medium | Small |
| Tuning of homogeneity at hospital | Impossible | Easy | Easy |

In magnetic systems where the field distribution is determined by the magnetic pieces alone, it is difficult to achieve accuracy with field errors in the order of 1/100 or 1/1000. Thus, methods and techniques which achieve these small errors use high permeability material together with "tuning" or adjusting the assemblies to the required degree of precision.

In order to create a uniform magnetic field, a permanent magnet, steel (or other materials) surrounding the permanent magnet, a shim and a support structure must be effectively designed. A patient must also be able easily to access the magnetic field generating device, and therefore the size of a structure which surrounds the body of the patient must be reduced. A method must also be provided for raising the uniformity of the magnetic field and for matching the magnetic field strength from each magnetic pole with a smaller permanent magnet.

A need exists for a magnetic field generating apparatus for a magnetic resonance imaging (MRI) system with an improved structure in which a permanent magnet shim and a booster shim are included.

SUMMARY OF THE INVENTION

In accordance with one aspect of the present invention, there is provided a magnetic field generating apparatus for an MRI system adopting a C-shaped open magnet support structure. The apparatus includes a pair of polygonal permanent magnets for creating a primary magnetic field, disposed parallel to each other in the horizontal plane, with a predetermined imaging area therebetween. A pair of polygonal magnetic pole plates are stacked to face each other on the inner sides of the pair of permanent magnets, respectively, for making the magnetic field produced from the permanent magnets uniform in the imaging area. The permanent magnets are fixed to a pair of yokes. At least one column connects the two yokes at one of their respective ends, with the imaging area being interposed between the yokes, wherein the at least one column together with the pair of yokes forms a closed path of the magnetic field. The apparatus further includes shims, having a polygonal shape, disposed at the vertexes of each of the polygonal magnetic pole plates, wherein the shims of one of the polygonal magnetic pole plates face those of the other polygonal magnetic pole plate. Peripheral permanent magnets are disposed along the edges of the polygonal magnetic pole plates, for inducing a magnetic field produced from the permanent magnets into the imaging area, wherein the peripheral permanent magnets of one of the polygonal magnetic pole plates face those of the other polygonal magnetic pole plate. Booster shims, which assist the function of the peripheral permanent magnets, are arranged in the spaces between adjacent peripheral permanent magnets disposed at the vertexes of the polygonal magnetic pole plates.

Preferably, the permanent magnets are formed of an alloy of neodymium-iron-boron (Nd—Fe—B) and the magnetic pole plates are formed of steel.

In more particular embodiments, the shims comprise positive and negative shim rings. The positive shim rings have a polygonal shape and are disposed at the edges of the polygonal magnetic pole plates, wherein the positive shim ring of one of the magnetic pole plates faces that of the other magnetic pole plate. The negative shim rings are embedded at the edges of the polygonal magnetic pole plates, at the inner sides of the positive shim rings, wherein the negative shim ring of one of the magnetic pole plates faces that of the other magnetic pole plate. Preferably, the positive shim rings are formed of low-carbon steel.

In another preferred embodiment, the magnetic field generating apparatus further comprises magnetic clamps disposed around the peripheral permanent magnets, being fixed to the yokes, for preventing the magnetic flux from leaking through both the sides of the magnetic pole plates, together with the peripheral permanent magnets. The magnetic field generating apparatus comprises, in additional preferred embodiments, permanent magnet shim bricks on the positive shim rings. According to still other preferred embodiments, the magnetic field generating apparatus further comprises a plurality of cap screws for fixing the two magnetic pole plates to the yokes, and controlling the arrangement of the two magnetic pole plates to be parallel each other.

Methods of producing a uniform magnetic field in an apparatus as described herein are also provided.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The above features and advantages of the present invention will become more apparent by describing in detail a preferred embodiment thereof with reference to the attached drawings in which.

DESCRIPTION OF THE PREFERRED EMBODIMENTS

Korean patent application No. 99-16601, filed on May 10, 1999 and entitled "Magnetic Field Generating Apparatus for Magnetic Resonance Imaging System" is incorporated herein by reference in its entirety.

Figure 1:
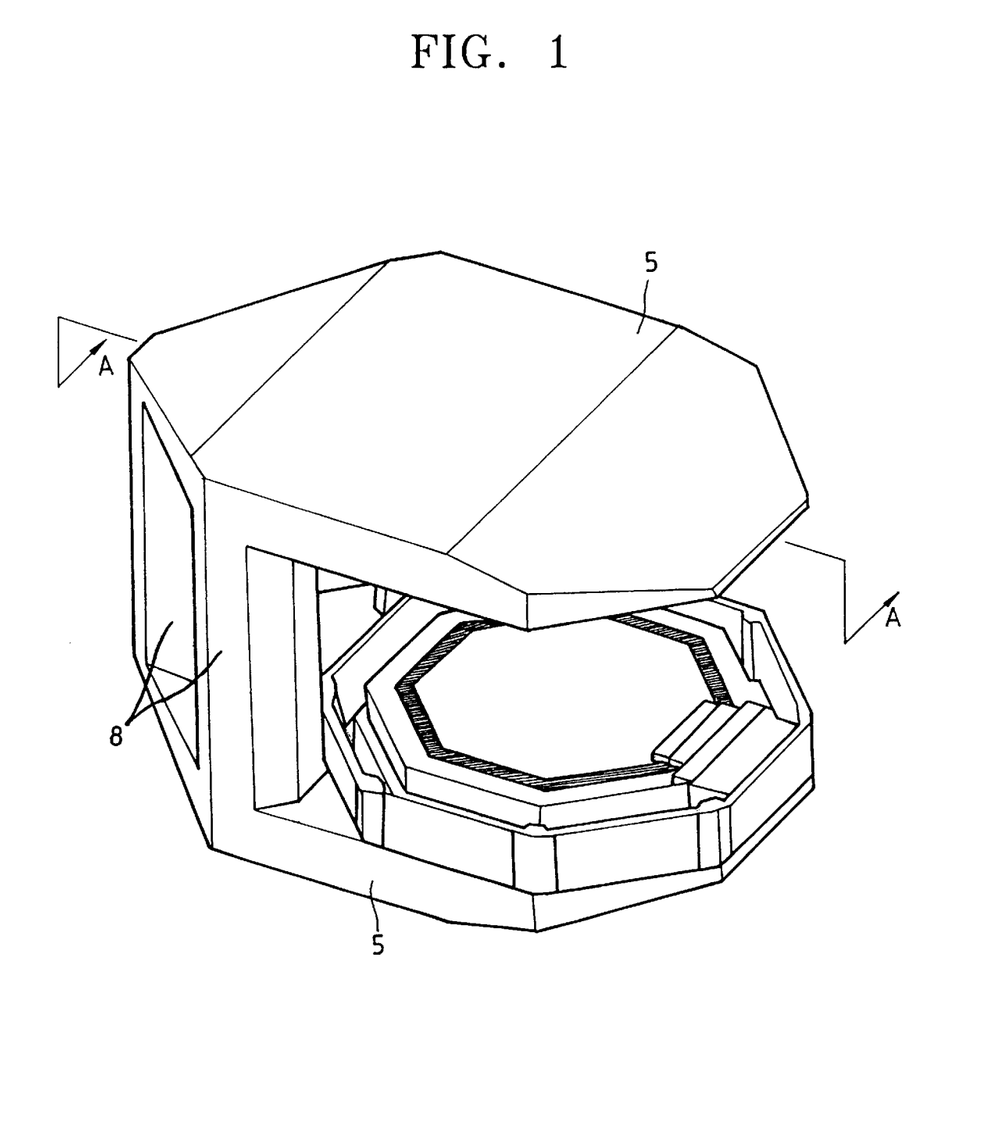
FIG. 1 is a perspective view of a magnetic field generating apparatus for a magnetic resonance imaging (MRI) system according to the present invention.

In FIG. 1, which is a perspective view of an embodiment of a magnetic field generating apparatus for a magnetic resonance imaging (MRI) system according to the present invention, the magnetic field generating apparatus includes a frame, for example, a pair of yokes including an upper yoke 5 and a lower yoke 5', for supporting all magnetic bricks. The upper yoke 5 and the lower yoke 5' for supporting permanent magnets 9 (see FIG. 3) and magnetic pole plates 4 (see FIG. 2 or 3) are spaced a predetermined interval to allow a photographing space. The upper and lower yokes 5 and 5' are connected by at least one column 8. In the illustrated embodiment, three columns 8 which are arranged in the form of a triangle are used. At least one of the columns 8 preferably is used to adjust the area of the photographing space between the upper and lower yokes 5 and 5'.

Figure 2:
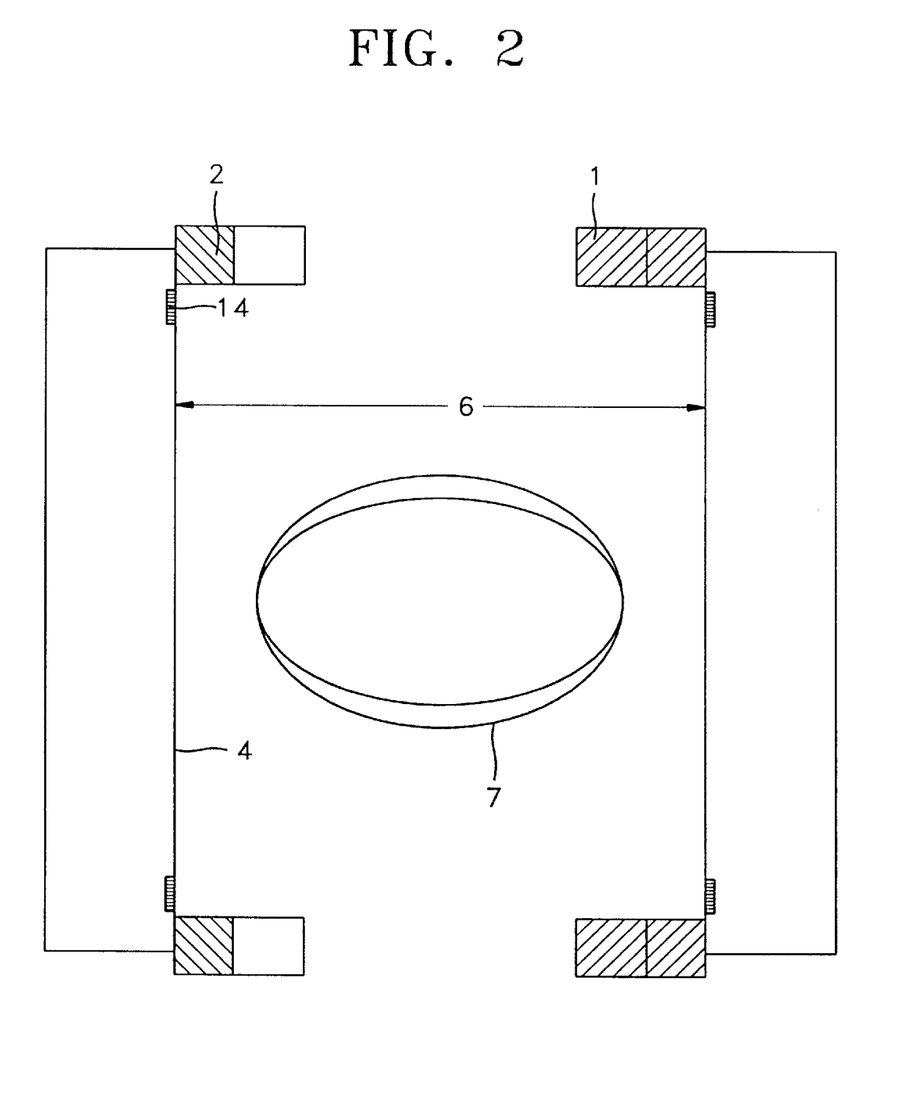
FIG. 2 is a sectional view of the magnetic pole surfaces of the magnetic field generating apparatus of FIG. 1.

FIG. 2 illustrates an embodiment of a magnetic field generating apparatus for an MRI system according to the present invention. As shown in FIG. 2, the magnetic field generating apparatus includes shims 2, which in preferred embodiments are permanent magnetic shims, permanent magnet bricks 1, and cap screws 12 and 13 (see FIG. 3) for supporting the magnetic pole plates 4 and for fixing the magnetic pole plates 4 to the yokes 5 and 5'. Edge shims 14, which preferably are as small as possible, and peripheral permanent magnets (bricks) 10 for compensating for the size of the magnetic pole plates 4, are attached to the edges of the magnetic pole plates 4, and magnetic field clamps 3 (see FIG. 3). preferably made of steel (Fe), are arranged in a polygonal shape around the peripheral permanent magnets 10, being fixed to the upper and lower yokes 5 and 5'. The lower and upper parts of the magnetic field generating apparatus, which are supported by the lower and upper yokes 5 and 5', respectively, are symmetrical with the same structure. Thus, the structure of the magnetic field generating apparatus according to the present invention will be described only with reference to the upper yoke 5.

The upper and lower yokes 5 and 5' are extended to provide a patient with a sufficient space which allows the patient to easily access the magnetic field generating apparatus, and are connected by the three columns 8. In other words, the three columns are arranged at the extended ends of the upper and lower yokes 5 and 5'. In particular, the cap screws 12 and 13, which are the means for supporting the magnetic pole plates 4, are also used as means for adjusting the arrangement of the magnetic pole plates 4 to be parallel each other.

As shown in FIG. 2, the edge shims 14, preferably made of steel (Fe), which has a high permeability, are relatively small compared to the permanent magnetic shims 2. Unlike the permanent magnet bricks 1, the shims 2, which in more particular embodiments are permanent magnetic shims, preferably are formed of low-carbon steel.

Figure 3:
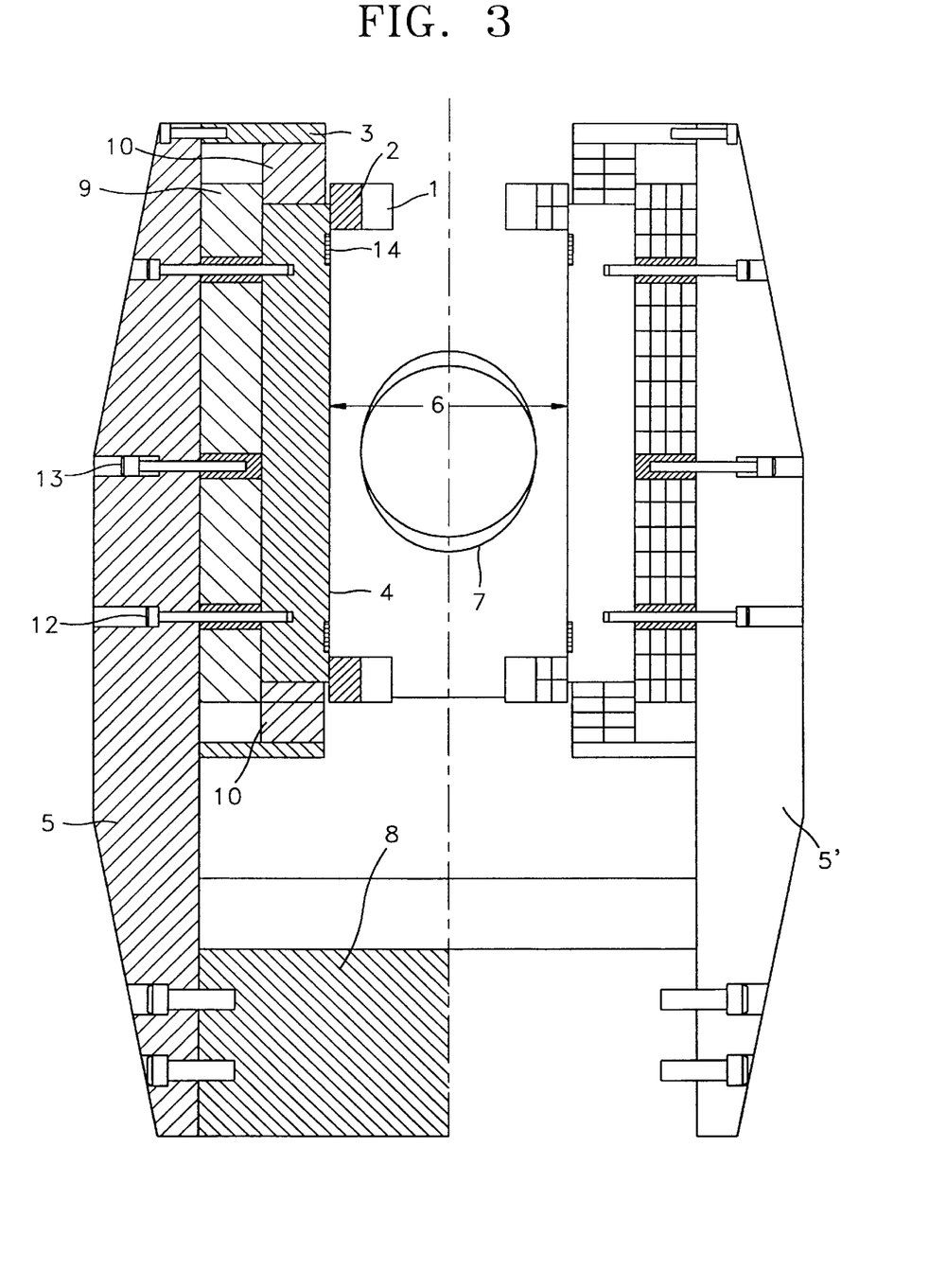
FIG. 3 is a sectional view taken along line A—A' of FIG. 1.

FIG. 3 is a sectional view of the magnetic field generating apparatus, taken along line A—A' of FIG. 1. The permanent magnet 9, which is arranged between the magnetic pole plate 4 and the upper yoke 5, is bonded to the upper yoke 5 preferably using epoxy, and the peripheral permanent magnet 10 is bonded to the magnetic field clamp 3 also preferably using epoxy. Magnetic flux is emitted from the N pole of one permanent magnet 9 to the S pole of the other permanent magn et 9 via a gap 6 between the facing magnetic pole plates 4. Also, the upper and lower yokes 5 and 5' and the columns 8, which are made of steel or a material having small reluctance, serve as a magnetic flux path. In preferred embodiments in which the upper and lower yokes 5 and 51, the columns 8, the magnetic pole plates 4, and the magnetic clamps 3 are formed of steel, the magnetic field strength produced in the frame structure is very strong.

Figure 4:
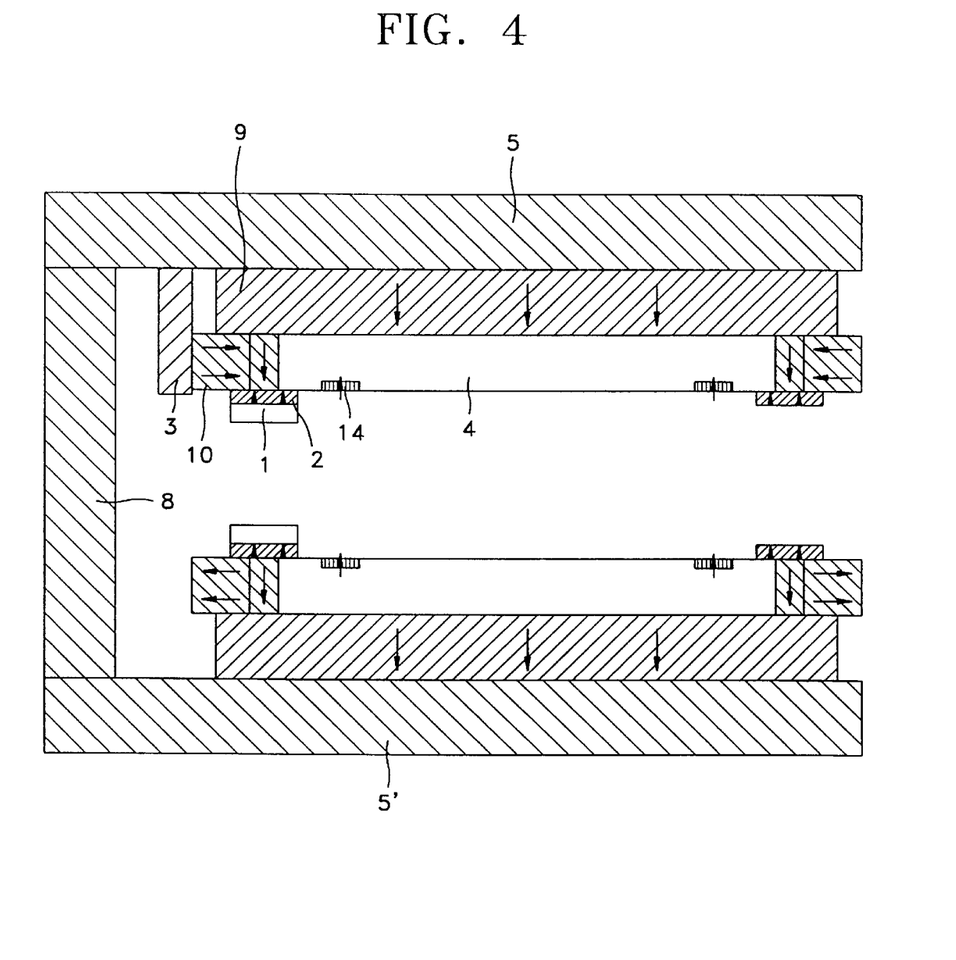
FIG. 4 is a vertical sectional view showing the magnetization direction of the magnet assemblies of the magnetic field generating apparatus of FIG. 1.

As shown in FIG. 4, the permanent magnet 9 and the peripheral permanent magnet 10 have the magnetization directions indicated by arrows. Due to the magnetization directions, a uniform magnetic field can be maintained within an imaging area 7 (see FIG. 2) in the gap 6. In preferred embodiments, the permanent magnet 9 and the peripheral permanent magnet 10 are formed of an alloy of neodymium-iron-boron (Nd—Fe—B). Other materials can also be used for the permanent magnet 9 and the peripheral permanent magnet 10.

The peripheral permanent magnet 10 connected to the magnetic clamp 3 prevents the magnetic flux from leaking through the sides of the magnetic pole plates 4, such that all the magnetic flux produced passes the imaging area (which can be referred as to a sample area) 7, minimizing a leakage flux from the fringe of the magnetic pole plates 4. The magnetic clamp 3 attached to the sides of the permanent magnet assembly, which preferably is made of steel, is also used to minimize the fringe magnetic field and does not cause saturation of the magnetic flux to occur. Furthermore, the upper and lower yokes 5 and 5', the magnetic clamps 3 and the columns 8, which form a support structure, produce a magnetiic flux return path.

The structure of the permanent magnet bricks 1 and the thickness and width of the magnetic pole plates are varied using commercially available software, such that the volume of the permanent magnets is minimized.

The magnetic field strength of the imaging area 7, the permanent magnet brick assembly, and the magnetic flux return structure in the magnetic field generating apparatus having the above structure is calculated by the energy equation expressed as the following equation (1).

$$\int B_0 H_0 dv(sv) + \int BH\, dv(iron) = \int BH\, dv(pm) \quad (1)$$

In the equation (1), B represents the magnetic flux density and H represents the magnetic field strength. Also, "sv" and "pm" are abbreviations for sample volume and permanent magnet bricks, respectively. Also, it is assumed that the magnetic field is uniform in the sample area 7 and any fringe magnetic field is negligible. If the permeability of iron is high, the magnetic field strength H of iron is equal to 0. Thus, the second term of the equation (1) is considerably smaller than the first term thereof, and thus the second term can be eliminated from the equation (1), resulting in the following equation (2).

$$\int B_0 H_0 dv(sv) = \int BH\, dv(pm) \quad (2)$$

As shown in the equation (2), the energy in the sample volume is determined by the permanent magnet bricks. In order to minimize the area occupied by the permanent magnet bricks at a given energy level, the arrangement of the permanent magnet bricks is optimized. This is because the area occupied by the permanent magnet bricks $\int dv(pm)$ becomes minimal when the product of B and H is maximal.

Figure 5:
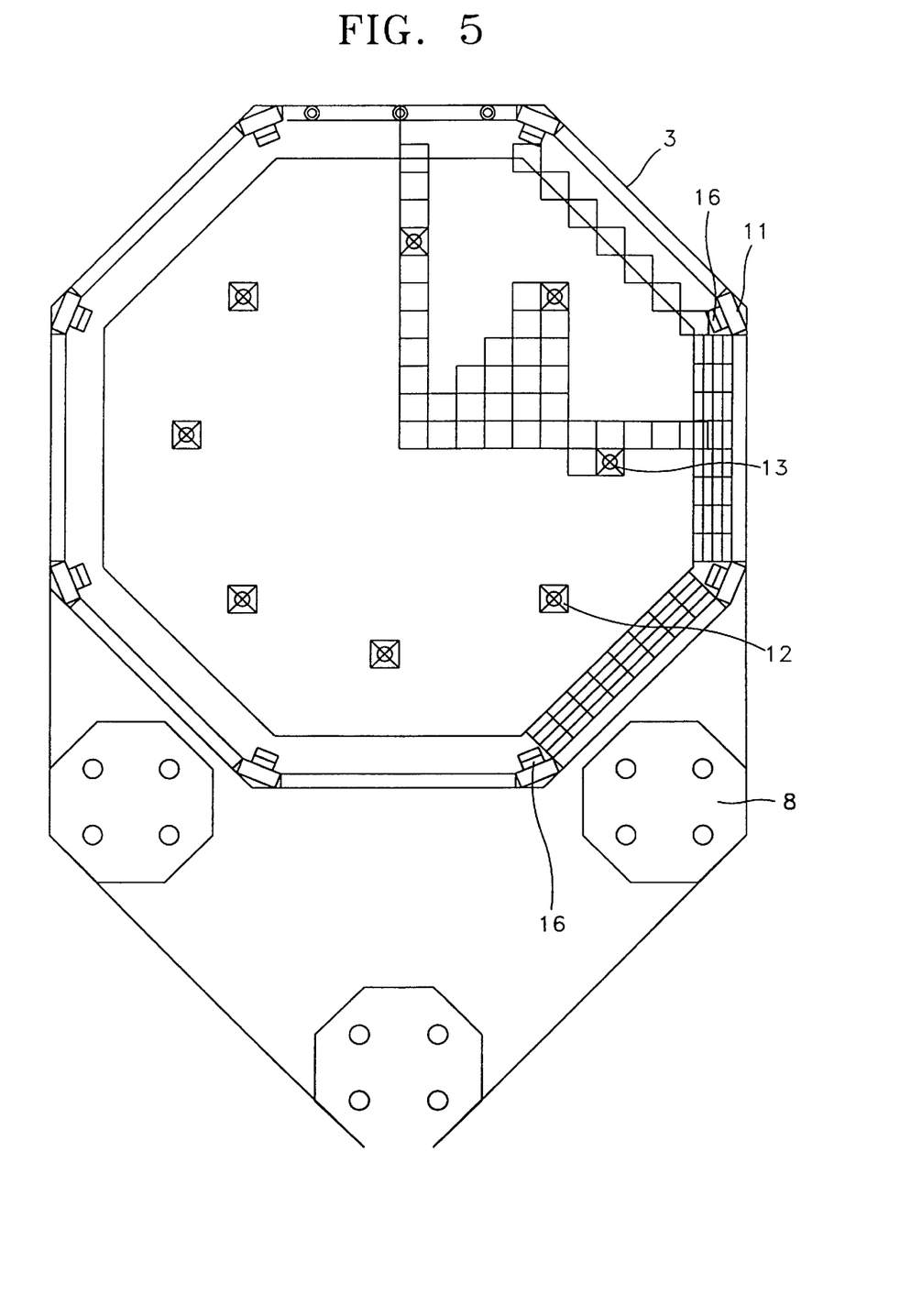
FIG. 5 is a sectional view of the magnetic field generating apparatus of FIG. 1.

FIG. 5 is a horizontal sectional view of the magnetic field generating apparatus of FIG. 1, illustrating the arrangement of the permanent magnet bricks, the columns, and the assembly thereof. If the magnetic field strengths of the two magnetic pole plates, which are not shown in FIG. 5, are different, a gradient field is created within the imaging area, thereby lowering the uniformity of the magnetic field. The magnetic pole plates may have different magnetic field strengths depending on a change in the permanent magnetic bricks and other peripheral elements. The magnetic field strength between each permanent magnetic brick may be different by several percentages. In such cases, several percents per million of difference in the magnetic field strength exists between the magnetic pole plates, raising a need for correcting the magnetic field strength difference. Such difference in the magnetic field strength between the magnetic pole plates can be corrected using booster bricks 16 and a small magnetic clamps 11. Also, the magnetic field strength of the magnetic pole can be adjusted by increasing or decreasing the number of permanent magnet bricks, thereby decreasing the gradient of the strength of the magnetic poles.

As shown in FIGS. 3 and 5, the magnetic pole plates 4 are supported by the cap screws 12 and 13. In order to produce a uniform magnetic field, the magnetic pole plates facing each other must be arranged to be parallel each other with a high accuracy, such that a gradient of the magnetic field created in a direction parallel to the magnetic pole plates is minimized. Such arrangement of the magnetic pole plates is adjusted by the cap screws 12 and 13. In order to adjust the arrangement is of the magnetic pole plates, first the magnetic field strength within a central plane of the imaging area 7 is measured as a reference, and the arrangement of the magnetic pole plates 4 is adjusted using the cap screws 12, while a magnetic field strength in the peripheral plane of the imaging area is measured until the strength of the peripheral magnetic field is close to that of the central plane. Then, the magnetic field strength through the imaging area 7 is remeasured for confirmation. This process is repeated to all the magnetic pole plates. If it is confirmed that the magnetic field strength is uniform, the magnetic pole plates 4 are tightly fixed to the upper and lower yoke 5 and 5' using the cap screws 13.

In addition, the magnetic field generating apparatus according to the present invention adopts the principle for compensating for the limited size of the magnetic pole plates to create a uniform magnetic field. The principle adopted in the present invention is referred to as "edge shimming", simply "shimming" or a "pole protrusion". The method is applied to the edges of the structure. Such shims are formed of a material having a high permeability, for example, a low-carbon steel. In particular, the shim brick 1 shown in FIG. 2 is arranged near the edge of the magnetic pole plates 4.

As an improvement of the method, shims 2 and 14, made of permanent magnets instead of the carbon steel, are used. The compensation effect of the permanent magnetic shim is high compared to a shim formed of carbon steel, so that the size of the shim can be reduced by using the permanent magnet. The shims 2 and 14 can comprise positive shim rings and negative shim rings 14, as shown in FIG. 3, to produce a uniform magnetic field. Also, the location of the shims 2 and 14 are optimized. The last tuning process is to finely adjust the location of the shims 2 and 14.

Figure 6:
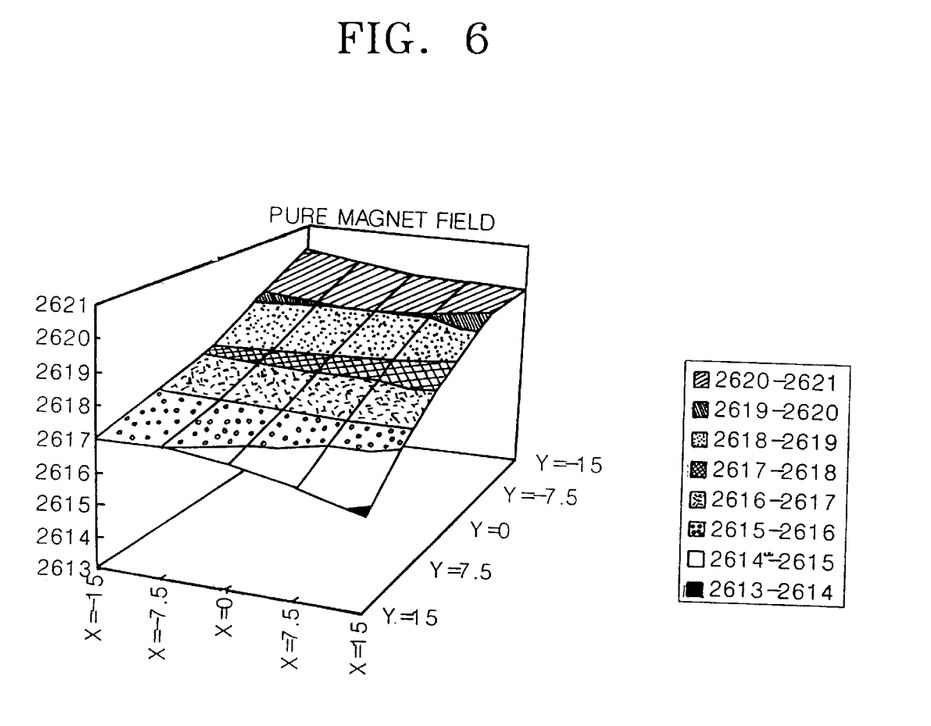
FIG. 6 is a graph showing the distribution of magnetic flux density in an imaging area of the magnetic field generating apparatus of FIG. 1.

FIG. 6 shows the distribution of magnetic flux density in the imaging area 7 of the magnetic field generating apparatus according to an embodiment of the present invention. As shown in FIG. 6, the maximum magnetic flux at DSV=15 cm is 2619.05 Gauss, the magnetic flux at the center of the imaging area 7 is 2618.23 Gauss, and PPM is 333 Gauss.

As described above, preferred embodiments of the magnetic field generating apparatus for an MRI system according to the present invention comprise the permanent magnetic bricks, the permanent pole plates, the permanent magnetic shims surrounding the pole plates, the edge shims made of a high permeability material with the smallest volume, the peripheral permanent magnet bricks for compensating for the size limit of the magnetic pole plates, and the magnetic clamps which are connected to the neighboring yoke and are disposed around the polygonal permanent magnet bricks. In particular, the lengths of the yokes are extended and three columns support the yokes at the ends thereof, such that a patient can easily enter the imaging area of the apparatus. Also, the cap screws which support the magnetic pole plates can adjust the arrangement of the magnetic pole plates to be parallel each other. The magnetic field generating apparatus according to the present invention, having the above structure, provides the following advantages.

First, by effectively designing the magnetic field generating apparatus, for example, by appropriately arranging the permanent magnet bricks, using steel as a material, and adopting shims, the magnetic field produced from each magnetic pole plate can be adjusted such that a gradient magnetic field is to be minimal at a predetermined space, that is, at an imaging area, thus raising the uniformity of the magnetic field.

Second, due to the effective structure capable of enforcing the strength of the magnetic field, such as magnetic flux return path, the volumes of each constituent element can be reduced, which allows maximum patient access to the imaging area.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A magnetic field generating apparatus for a magnetic resonance imaging (MRI) system adopting a C-shaped open magnet support structure, the apparatus comprising:
    (a) a pair of polygonal permanent magnets disposed parallel to each other in the horizontal plane, with a predetermined imaging area therebetween;
    (b) a pair of polygonal magnetic pole plates, stacked to face each other on the inner sides of the pair of permanent magnets, respectively;
    (c) a pair of yokes to which the permanent magnets are fixed;
    (d) at least one column for connecting the two yokes at one ends thereof with the imaging area being interposed between the yokes, wherein the at least one column together with the pair of yokes forms a closed path of the magnetic field;
    (e) shims disposed at the vertexes of the polygonal magnetic pole plates, the shims having a polygonal shape, wherein the shims of one of the polygonal magnetic pole plates face those of the other polygonal magnetic pole plate;
    (f) peripheral permanent magnets disposed along the edges of the polygonal magnetic pole plates, wherein the peripheral permanent magnets of one of the polygonal magnetic pole plates face those of the other polygonal magnetic pole plate; and
    (g) booster shims arranged in the spaces between adjacent peripheral permanent magnets disposed at the vertexes of the polygonal magnetic pole plates.

2. The magnetic field generating apparatus of claim 1, wherein the permanent magnets and peripheral permanent magnets are formed of an alloy of neodymium-iron-boron (Nd—Fe—B).

3. The magnetic field generating apparatus of claim 1, wherein the magnetic pole plates are formed of steel.

4. The magnetic field generating apparatus of claim 1, wherein the booster shims comprise:
    positive shim rings having a polygonal shape disposed at the edges of the polygonal magnetic pole plates, wherein the positive shim ring of one of the magnetic pole plate faces that of the other magnetic pole plate; and
    negative shim rings being embedded at the edges of the polygonal magnetic pole plates, at the inner sides of the positive shim rings, wherein the negative shim ring of one of the magnetic pole plate faces that of the other magnetic pole plate.

5. The magnetic field generating apparatus of claim 4, wherein the positive shim rings are formed of low-carbon steel.

6. The magnetic field generating apparatus of claim 1, further comprising magnetic clamps disposed around the peripheral permanent magnets, being fixed to the yokes together with the peripheral permanent magnets.

7. The magnetic field generating apparatus of claim 5, further comprising permanent magnet shim bricks on the positive shim rings.

8. The magnetic field generating apparatus of claim 1, wherein three columns are arranged at one end of the each of the yokes to provide a stable support structure.

9. The magnetic field generating apparatus of claim 1, further comprising a plurality of cap screws that fix the magnetic pole plates to the yokes and control the arrangement of the magnetic pole plates.

10. A method of producing a uniform magnetic field in an imaging area of a magnetic field generating apparatus for a magnetic resonance imaging (MRI) system adopting a C-shaped open magnet support structure, the apparatus comprising:
    (a) a pair of polygonal permanent magnets disposed parallel to each other in the horizontal plane, with a predetermined imaging area therebetween, the imaging area having a central plane and a peripheral plane;
    (b) a pair of polygonal magnetic pole plates, stacked to face each other on the inner sides of the pair of permanent magnets, respectively;
    (c) a pair of yokes to which the permanent magnets are fixed;
    (d) at least one column for connecting the two yokes at one ends thereof with the imaging area being interposed between the yokes, wherein the at least one column together with the pair of yokes forms a closed path of the magnetic field;
    (e) shims disposed at the vertexes of the polygonal magnetic pole plates, the shims having a polygonal shape, wherein the shims of one of the polygonal magnetic pole plates face those of the other polygonal magnetic pole plate;

(f) peripheral permanent magnets disposed along the edges of the polygonal magnetic pole plates, wherein the peripheral permanent magnets of one of the polygonal magnetic pole plates face those of the other polygonal magnetic pole plate;

(g) booster shims arranged in the spaces between adjacent peripheral permanent magnets disposed at the vertexes of the polygonal magnetic pole plates; and (h) a plurality of cap screws that fix the magnetic pole plates to the yokes and control the arrangement of the magnetic pole plates, the method comprising the steps of:

(i) measuring the magnetic field strength within the central plane of the imaging area, (ii) adjusting the arrangement of the magnetic pole plates using the cap screws while measuring the magnetic field strength in the peripheral plane of the imaging area, (iii) determining the difference between the magnetic field strength in the peripheral plane of the imaging area and the central plane of the imaging area, (iv) repeating steps (i)–(iii) until the difference is less than a predetermined value, and (v) tightening the cap screws to secure the magnetic pole plates to the yokes.

* * * * *